United States Patent [19]
Moyer et al.

[11] Patent Number: 5,164,329
[45] Date of Patent: Nov. 17, 1992

[54] FABRICATING A LOW LEAKAGE CURRENT LED

[75] Inventors: Curtis D. Moyer, Pheonix; Steven A. Voight, Gilbert, both of Ariz.

[73] Assignee: Motorola, Inc., Schaumburg, Ill.

[21] Appl. No.: 767,956

[22] Filed: Sep. 30, 1991

[51] Int. Cl.⁵ .................. H01L 21/20; H01L 21/225
[52] U.S. Cl. ...................... 437/126; 437/23; 437/158; 437/905; 437/969
[58] Field of Search ............... 437/23, 126, 127, 129, 437/133, 139, 158, 160, 905, 969; 148/DIG. 31, DIG. 65, DIG. 72, DIG. 99, DIG. 67; 357/17; 372/45, 46

[56] References Cited

U.S. PATENT DOCUMENTS

| | | | |
|---|---|---|---|
| 4,670,689 | 6/1987 | Suzuki | 357/17 |
| 4,864,369 | 9/1989 | Snyder et al. | 357/17 |
| 5,061,656 | 10/1991 | Moyer et al. | 437/127 |

FOREIGN PATENT DOCUMENTS 0231885 12/1984 Japan .................. 437/126

*Primary Examiner*—Brian E. Hearn
*Assistant Examiner*—C. Chaudhari
*Attorney, Agent, or Firm*—Joe E. Barbee

[57] ABSTRACT

A method of reducing the leakage current of a III-V compound semiconductor device (10) includes providing the device with a confinement layer having two sections (13, 14). A first section (14) has a higher doping concentration than a second section (13). An energy barrier that confines minority carriers to an active layer (12) of the device (10) is formed by diffusing a dopant into a portion of the active layer (12) and the two sections (13, 14) of the confinement layer. During the diffusion, the conductivity type of a portion of the lower doped second section (13) is inverted while the higher doped first section (14) is not inverted.

20 Claims, 1 Drawing Sheet

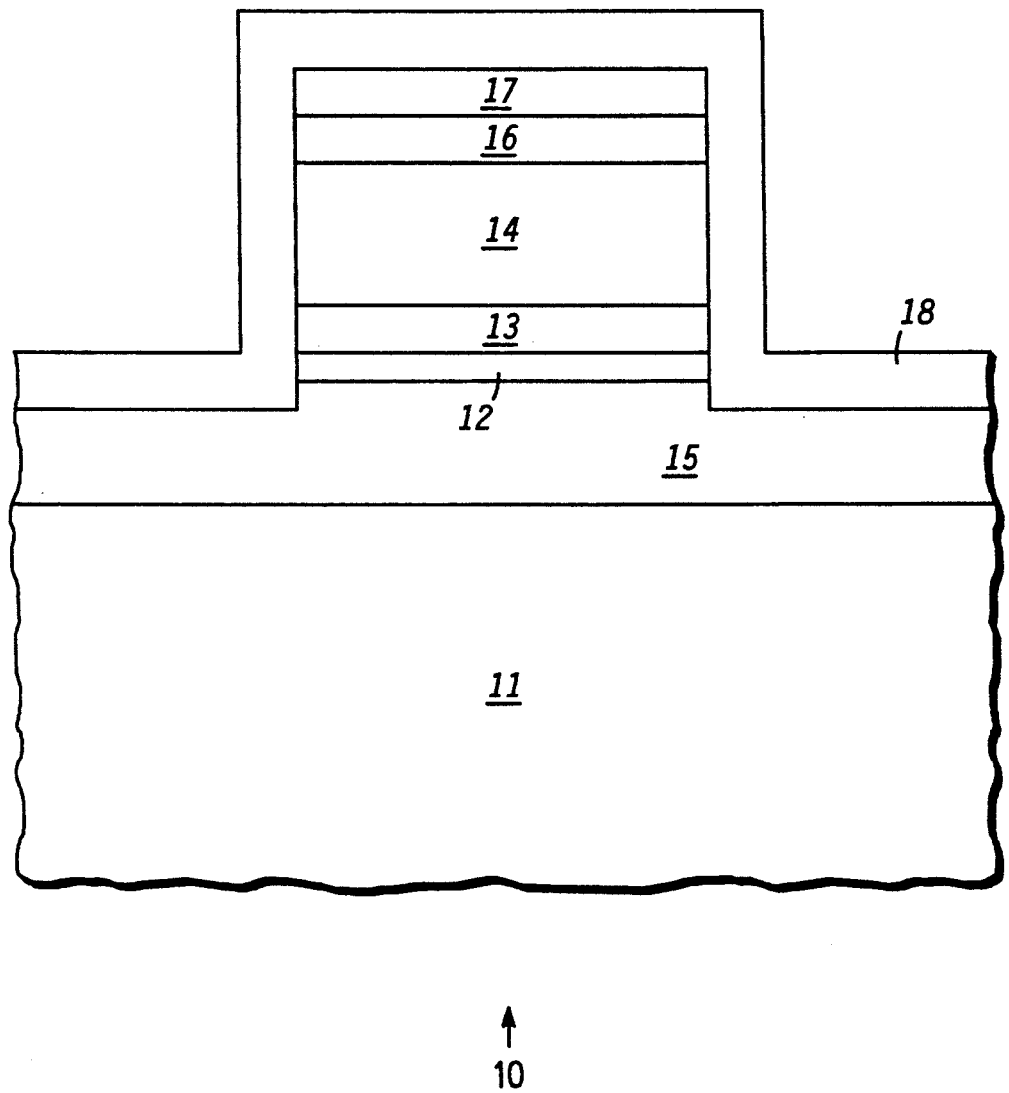

FABRICATING A LOW LEAKAGE CURRENT LED

BACKGROUND OF THE INVENTION

The present invention relates, in general, to semiconductor devices, and more particularly, to a novel low leakage current semiconductor device.

Previously, the semiconductor industry had used impurity induced disordering (IID) to assist in providing minority carrier confinement in III-V compound semiconductor devices such as light emitting diodes (LEDs), lasers, heterojunction bipolar transistors, and the like. These previous impurity induced disordering (IID) techniques generally involved diffusing a dopant or impurity into a semiconductor structure in order to cause migration of the semiconductor material. The migrated semiconductor material created an energy barrier that assisted in confining minority carriers. The source of the dopant generally was a material that was applied to the device structure and heated to diffuse the dopants from the source material into the semiconductor structure. Use of such IID techniques required accurate placement of the source material in order to control the dopant's location and concentration within the semiconductor device. Inaccurate placement often created leaky P-N diodes which increased the device's leakage current.

In addition, semiconductor devices that used IID usually exhibited a sensitivity to high temperatures, such as those encountered during rapid thermal anneal procedures. During high temperature annealing of the device's metal electrodes, the device's passivation layer functioned as a dopant or impurity source from which dopants were diffused into the semiconductor device thereby enlarging the device's leaky P-N diode and increasing the device's leakage current.

Accordingly, it is desirable to have a method of controlling minority carriers near lateral edges of a P-N junction wherein the method is insensitive to subsequent high temperature processing operations, and is independent of the placement of a dopant source material.

SUMMARY OF THE INVENTION

Briefly stated, the present invention includes reducing the leakage current of a III-V compound semiconductor device by providing a confinement layer that has two sections. A first section has a higher doping concentration than a second section. An energy barrier that confines minority carriers to an active layer is formed by inverting the conductivity type of a portion of the active layer and the lower doped second section while not inverting the conductivity type of the higher doped first section.

BRIEF DESCRIPTION OF THE DRAWINGS

The sole FIGURE is an enlarged cross sectional view of the preferred embodiment of an LED in accordance with the present invention.

DETAILED DESCRIPTION OF THE DRAWINGS

Confinement of minority carriers within a semiconductor device's active area can be increased by using impurity induced disordering (IID) to form an energy barrier in the lateral edges of the active area. IID can be used to increase the active area's band-gap in these lateral edges which assists in forming the energy barrier. IID results from impurities or dopants that are diffused into the active area thereby causing semiconductor material from adjacent areas to diffuse into the doped portion of the active area. One example of such a semiconductor device is represented in U.S. Pat. No. 5,061,656 issued to Moyer et al. on Oct. 29, 1991 which is hereby incorporated herein by reference.

The sole FIGURE illustrates a portion of the preferred embodiment of a semiconductor device that is a light emitting diode (LED) 10. LED 10 includes a III-V compound semiconductor substrate 11 which may contain a plurality of III-V compound layers. Substrate 11 is covered by an N-type aluminum gallium arsenide (AlGaAs) injection layer 15 which is epitaxially formed as the top layer of substrate 11. A portion of injection layer 15 is covered by a P-type AlGaAs active layer 12 which has a lower aluminum arsenide mole fraction than injection layer 15. Active layer 12 is covered with a P-type AlGaAs first confinement layer 13. Injection layer 15 and first confinement layer 13 have higher aluminum arsenide mole fractions than active layer 12 in order to form a band-gap structure that vertically confines minority carriers to active layer 12. As will be seen hereinafter, the difference in aluminum arsenide concentrations is also used to provide an energy barrier that laterally confines carriers within active layer 12. A P-type AlGaAs second confinement layer 14 covers first confinement layer 13, and also has an aluminum arsenide (AlAs) mole fraction that is higher than the AlAs mole fraction of active layer 12. Consequently, second confinement layer 14 also assists in vertically confining minority carriers to active layer 12. First and second confinement layers 13 and 14 can be considered as two sections of a single confinement layer. In the preferred embodiment, injection layer 15, first confinement layer 13, and second confinement layer 14 have an AlAs mole fraction between fifty and eighty percent while active layer 12 is less than forty percent. A P-type AlGaAs contact layer 16, and a P-type GaAs cap layer 17 are used to form ohmic contacts to LED 10. Layers 12, 13, 14, 15, 16, and 17 are epitaxially formed on substrate 11 by methods such as metal organic chemical vapor deposition (MOCVD), plasma enhanced chemical vapor deposition (PECVD), molecular beam epitaxy (MBE), and other epitaxial methods that are well known to those skilled in the semiconductor art. Layers 12, 13, 14, 16, 17 and a portion of injection layer 15 are then formed into a mesa structure that exposes the lateral edges or sides of layers 12, 13, 14, 15, 16, and 17 as illustrated by LED 10. It is important that a portion of injection layer 15 be removed in order to form a portion of injection layer 15 into the mesa structure thereby exposing edges or sides of injection layer 15. Methods for forming such mesa structures are well known to those skilled in the semiconductor art. Subsequently, dopant source 18 is deposited covering the mesa structure and a portion of injection layer 15.

Impurity induced disordering (IID), is used to facilitate formation of the energy barrier that confines carriers near the lateral edges of active layer 12. The IID is created by diffusing an impurity or dopant from dopant source 18 laterally into a portion of the exposed lateral edges of injection layer 15, active layer 12, first confinement layer 13, and second confinement layer 14. As will be seen hereinafter, diffusing the dopant into LED 10, not only allows IID to form the energy barrier, but the dopant also changes the conductivity type of a portion of layers 12 and 13 thereby further increasing the energy barrier. In the preferred embodiment, dopant source 18 is a layer of silicon nitride ($Si_3N_4$) that functions as a silicon dopant source. Other silicon materials such as silicon dioxide ($SiO_2$) and the like may also be used.

It is believed that silicon penetration into the lateral edges of layers 12, 13, 14, 15, and 16 is facilitated by a reaction between silicon nitride and the aluminum arsenide of the aluminum gallium arsenide as shown by the equation below:

$$Si_3N_4 + 4AlAs \rightarrow 3SiAs + 4AlN + V_{III}As$$

where;

$V_{III}$ represents a vacancy of a group 111 element. Three silicon (Si) atoms from $Si_3N_4$ Combine with three arsenic (As) atoms from the aluminum arsenide (AlAs) to form three molecules of silicon arsenide (SiAs). The four nitrogen atoms (N) from $Si_3N_4$ combine with the four aluminum atoms from the AlAs to form four molecules of aluminum nitride (AlN). In active layer 12, the aluminum nitride is formed at the extreme edges near the interface between active layer 12 and dopant source 18. Since AlN is not mobile, it binds the aluminum near the interface with the $Si_3N_4$ which causes an insignificant reduction in the aluminum content in that area. The reaction forms one unpaired arsenic ion that has a vacant group 3 site ($V_{III}$). This vacancy is a place where a group 4 atom, Such as silicon, may attach. It is believed that vacant group 3 sites ($V_{III}$) provide a diffusion mechanism that allows silicon atoms to migrate from one arsenic atom to a group 3 vacancy on another arsenic atom and from there to another group 3 vacancy on a different arsenic atom, etc. thereby sustaining the silicon diffusion into the gallium aluminum arsenide.

The depth of the silicon penetration into the edges of layers 12, 13, 14, 15, and 16 can be minimized. By adjusting process gas flows during the deposition of doping source 18, a silicon-rich silicon nitride ($Si_4N_4$) in which a portion of the silicon nitride molecules have a higher than normal silicon concentration can be formed. It is understood that as used herein "$Si_4N_4$" means an amorphous material containing $Si_3N_4$ and Si. It is believed that the high silicon content reduces the silicon diffusion rate into the AlGaAs material. As shown by the equation below:

$$Si_4N_4 + 4AlAs \rightarrow 4SiAs + 4AlN$$

group 3 vacancy sites are not formed at the higher silicon content ($Si_4N_4$). As a result, high silicon content films provide high silicon dopant concentrations, but lower diffusion rates. It is also believed that high silicon content silicon nitride contains a mixture of both $Si_3N_4$ and $Si_4N_4$. Consequently, the $Si_3N_4$ portion of the silicon nitride provides the diffusion mechanism, while the $Si_4N_4$ portion of the silicon nitride increases the doping concentration. This high silicon concentration facilitates forming a higher silicon doping concentration while limiting the diffusion depth into the gallium aluminum arsenide.

By way of example, after approximately one hour at 850 degrees Celsius, a low silicon content ($Si_3N_4$) silicon nitride film produces a peak silicon dopant concentration at the surface of approximately $7 \times 10^{17}$ atoms/cm$^3$ and a diffusion depth of approximately 1.0 microns. A high silicon content ($Si_4N_4$) silicon nitride film, under the same conditions, produces a peak concentration at the surface of approximately $2 \times 10^{18}$ atoms/cm$^3$, but a diffusion depth of only 0.3 microns. Away from the surface, the doping concentration resulting from the $Si_4N_4$ rapidly falls off to approximately $1 \times 10^{17}$ atoms/cm$^3$. For LED 10, the high doping concentration and shallower depth is preferable for facilitating accurate control of the energy barrier location within LED 10.

The silicon diffusion facilitates the migration of aluminum from high aluminum concentration areas to lower aluminum concentration areas. Outside the silicon doped area, the aluminum concentrations remains unchanged. Since the aluminum content of active layer 12 is lower than in adjacent layers 13 and 15, a portion of the aluminum content of layers 13 and 15 migrates into active layer 12 and increases the aluminum concentration. This aluminum migration into active layer 12 only occurs in the areas where silicon is diffusing into layer 12, that is near the interface with dopant source 18. Outside the silicon doped area, the aluminum concentration remains unchanged. The increased aluminum concentration increases the band-gap of the silicon doped portion of active area 12 thereby forming the energy barrier. The penetration of the energy barrier into the lateral edges of active layer 12, is controlled by the penetration of the silicon from doping source 18 into the lateral edges of active layer 12.

As the silicon dopant is diffused into active layer 12, and first confinement layer 13, the conductivity type of the silicon doped portion of layers 12, and 13 is changed from P-type to N-type. This change forms a lateral P-N junction which further increases minority carrier confinement and reduces the leakage current of LED 10.

To reduce leakage current, the most desirable placement of the silicon dopant confines it to active layer 12 only. Outside of active layer 12, the silicon doped area forms a leaky P-N diode that provides a leakage current path between cap 17 and substrate 11. However, the energy barrier must extend just outside of active layer 12 in order to ensure that the energy barrier completely encloses minority carriers and confines them to active layer 12. The further the silicon doped area extends outside of active layer 12 into layers 13, 14, 16, and 17, the larger the area of the leaky P-N diode and the larger the leakage current. By controlling the P-type doping concentration of first confinement layer 13 and second confinement layer 14, it is possible to minimize the size of the leaky P-N diode. This can be accomplished by establishing the P-type doping concentration of layers 12 and 13 at a level which can easily be converted from P-type to N-type while establishing the P-type doping of layers 14, 16, and 17 at a level which prevents conversion to N-type. With such doping concentrations, the leaky P-N diode is limited to the silicon doped portions of active layer 12 and first confinement layer 13. Since injection layer 15 is N-type, it does not affect the leaky P-N diode.

In the preferred embodiment, active layer 12 and first confinement layer 13 have a P-type doping concentration that is less than $1 \times 10^{18}$ atoms/cm$^3$. Second confinement layer 14, contact layer 16, and cap layer 17 have a P-type doping concentration that is in excess of $3 \times 10^{18}$ atoms/cm$^3$. The $2 \times 10^{18}$ atoms/cm$^3$ silicon doping that is provided by a silicon rich silicon nitride dopant source 18 easily converts a portion of layers 12 and 13 to N-type while leaving layers 14, 16, and 17 P-type. This doping configuration minimizes the size of the leaky P-N diode and prevents forming a leakage path between cap layer 17 and substrate 11. Since the thickness of active layer 12 and first confinement layer 13 can be very accurately controlled by epitaxial deposition, the size of the leaky P-N diode can be minimized and the leakage current of LED 10 can be minimized.

The IID technique is facilitated by having the confinement layer formed in two sections. First confinement layer 13 has a P-type doping that facilitates inverting a portion of layer 13 to N-type. Second confinement layer 14 has a P-type doping that prevents inverting a portion to N-type. Consequently, the position of the energy barrier is independent of the vertical placement of doping source 18 and is dependent only on the thickness of active layer 12 and first confinement layer 13. This configuration of two separate confinement layers with two different doping concentrations is a significant improvement over previous IID techniques.

Since the P-type doping concentrations of layers 14, 16, and 17 is too high to permit converting to N-type, subsequent high temperature processing operations will not be able to convert these areas to N-type. Consequently, high temperature annealing of metal electrodes will not increase the leakage current of LED 10. In addition, doping source 18 does not have to be removed and may, if desired, remain on LED 10 during subsequent high temperature processing operations without affecting the leakage current. This is a significant improvement over previous IID techniques.

In the preferred embodiment, carbon is used as the P-type doping material since carbon is a non-mobile dopant that is not readily diffused by subsequent high temperature processing operations. Consequently, the use of carbon for the P-type dopant further improves the tolerance to subsequent high temperature processing operations.

While the invention is described with specific preferred embodiments, it is evident that many alternatives and variations will be apparent to those skilled in the semiconductor art. More specifically the invention has been described for a particular LED structure, although the method of forming the confinement layer with two different doping profiles wherein one profile can be converted from one conductivity to another is applicable to other structures, and other doping levels as well as to other aluminum containing III-V semiconductor compounds. It should also be noted that other dopant sources could also be utilized.

By now it should be appreciated that there has been provided a novel way to minimize the leakage current of a semiconductor device. Utilizing a confinement layer having two adjacent sections that have different doping concentrations facilitates accurate control of P-N junction placement during dopant diffusions. The different doping concentrations of the two sections minimizes the amount of material that is converted from P-type to N-type thereby reducing the leakage current. Also, the different doping of the two different sections reduces the sensitivity to the placement of the dopant source. Providing one confinement layer section with a dopant concentration that can not be converted from P-type to N-type improves the tolerance to high temperature processing operations. Use of carbon as the P-type dopant further improves the high temperature tolerance.

We claim:

1. A method of forming a low leakage current LED comprising:

providing an N-type III-V compound semiconductor substrate;

covering the substrate with an N-type injection layer;

covering a portion of the injection layer with a P-type active layer having sides that are exposed;

forming a P-type first confinement layer covering the active layer wherein the first confinement layer has sides that are exposed, the first confinement layer having a P-type dopant concentration that is less than approximately $1 \times 10^{18}$ atoms/cm$^3$;

forming a P-type second confinement layer on the first confinement layer wherein the second confinement layer has sides that are exposed, the second confinement layer having a P-type dopant concentration that is greater than approximately $3 \times 10^{18}$ atoms/cm$^3$;

covering the second confinement layer with a contact layer;

covering a portion of the substrate, the sides of the active layer, the sides of the first confinement layer, the sides of the second confinement layer, and the contact layer with a material that is a source of an N-type dopant; and converting a portion near the edges of the active layer and the first confinement layer to an N-type material while leaving the second confinement layer as the P-type material by diffusing a portion of the N-type dopant into the active layer, the first confinement layer, and the second confinement layer thereby migrating material from the injection layer and from the first confinement layer into the active layer for forming an energy barrier that confines minority carriers away from the edges of the active layer.

2. The method of claim 1 wherein covering the substrate with the injection layer includes covering the substrate with an aluminum gallium arsenide injection layer.

3. The method of claim 1 wherein covering the portion of the substrate with the P-type active layer includes covering the portion of the substrate with an aluminum gallium arsenide active layer.

4. The method of claim 1 wherein forming the P-type first confinement layer includes forming an aluminum gallium arsenide first confinement layer.

5. The method of claim 1 wherein forming the P-type second confinement layer includes forming an aluminum gallium arsenide second confinement layer.

6. A method of forming an LED that has low leakage current comprising:

providing a substrate having an active layer of a first conductivity type on the substrate;

covering the active layer with a first confinement layer having a first doping concentration of the first conductivity type;

covering the first confinement layer with a second confinement layer having a second doping concentration of the first conductivity type wherein the second doping concentration is greater than the first doping concentration; and diffusing a dopant of a second conductivity type into a portion of the active layer, the first confinement layer, and the second confinement layer for the purpose of forming an energy barrier that confines minority carriers within the active layer wherein the dopant converts a portion of the active layer and a portion of the first confinement layer to the second conductivity type while leaving the second confinement layer as the first conductivity type.

7. The method of claim 6 wherein diffusing the dopant of the second conductivity type includes covering sides of the active layer, sides of the first confinement layer, and sides of the second confinement layer with a layer of silicon nitride and diffusing a silicon dopant from the silicon nitride layer.

8. The method of claim 6 wherein forming the active layer includes forming the active layer having a doping concentration of the first conductivity type that is less than $1 \times 10^{18}$ atoms/cm$^3$.

9. The method of claim 8 wherein having the doping concentration includes having a carbon doping concentration that is less than $1 \times 10^{18}$ atoms/cm$^3$.

10. The method of claim 6 wherein forming the active layer includes forming an aluminum gallium arsenide active layer having an aluminum arsenide mole fraction that is less than forty percent.

11. The method of claim 6 wherein covering the active layer with the first confinement layer includes forming the first confinement layer having the first doping concentration that is less than $1 \times 10^{18}$ atoms/cm$^3$.

12. The method of claim 11 wherein having the first doping concentration that is less than $1 \times 10^{18}$ atoms/cm$^3$ includes having a carbon doping concentration that is less than $1 \times 10^{18}$ atoms/cm$^3$.

13. The method of claim 6 wherein covering the first confinement layer with the second confinement layer includes forming the second confinement layer having the second doping concentration that is greater than $3 \times 10^{18}$ atoms/cm$^3$.

14. The method of claim 13 wherein having the second doping concentration that is greater than $3 \times 10^{18}$ atoms/cm$^3$ includes having a carbon doping concentration that is greater than $3 \times 10^{18}$ atoms/cm$^3$.

15. A method of reducing the leakage current of a III-V compound semiconductor device comprising:

providing an active layer on a III-V compound semiconductor substrate wherein the active layer is of a first conductivity type;

forming a first confinement layer of the first conductivity type on the active layer;

forming a second confinement layer of the first conductivity type on the first confinement layer, the second confinement layer having a first conductivity doping concentration that is greater than a first conductivity doping concentration of the first confinement layer; and converting a portion of the active layer and a portion of the first confinement layer to a second conductivity type while leaving the second confinement layer the first conductivity type for the purpose of forming an energy barrier that confines minority carriers to the active layer.

16. The method of claim 15 wherein the converting a portion of the active layer step includes diffusing an impurity into the portion of the active layer and the portion of the first confinement layer for the purpose of forming the energy barrier by migrating semiconductor material from the first confinement layer and the substrate into the active layer wherein the migrated semiconductor material increases a band-gap in the portion of the active layer containing the impurity.

17. The method of claim 16 wherein diffusing the impurity includes diffusing a silicon impurity.

18. The method of claim 15 wherein the forming the second confinement layer step includes forming an aluminum gallium arsenide second confinement layer on an aluminum gallium arsenide first confinement layer.

19. The method of claim 15 wherein the forming the second confinement layer step includes forming the second confinement layer having the first conductivity doping concentration that is greater than $3 \times 10^{18}$ atoms/cm$^3$.

20. The method of claim 16 wherein diffusing the impurity into the portion of the active layer includes covering lateral edges of at least the active layer, the first confinement layer, and the second confinement layer with a layer of silicon nitride and diffusing a silicon impurity from the silicon nitride.

* * * * *